United States Patent
Sourani

(10) Patent No.: US 10,078,032 B2
(45) Date of Patent: Sep. 18, 2018

(54) CIRCUIT FOR DETECTION OF FAILURE OF A MOVABLE MEMS MIRROR

(71) Applicant: STMicroelectronics LTD, Netanya (IL)

(72) Inventor: Sason Sourani, Hod Hasharon (IL)

(73) Assignee: STMicroelectronics LTD, Netanya (IL)

( * ) Notice: Subject to any disclaimer, the term of this patent is extended or adjusted under 35 U.S.C. 154(b) by 0 days.

(21) Appl. No.: 15/188,455

(22) Filed: Jun. 21, 2016

(65) Prior Publication Data

US 2017/0363506 A1  Dec. 21, 2017

(51) Int. Cl.
| | | |
|---|---|---|
| *G01M 11/00* | (2006.01) | |
| *G02B 26/08* | (2006.01) | |
| *G08B 21/18* | (2006.01) | |
| *B81B 3/00* | (2006.01) | |

(52) U.S. Cl.
CPC ............ *G01M 11/005* (2013.01); *B81B 3/00* (2013.01); *G02B 26/0833* (2013.01); *G02B 26/0841* (2013.01); *G08B 21/185* (2013.01)

(58) Field of Classification Search
CPC . G01M 11/005; G02B 26/0833; G08B 21/185
USPC .................................................. 324/691–727
See application file for complete search history.

(56) References Cited

U.S. PATENT DOCUMENTS

| | | | | |
|---|---|---|---|---|
| 5,841,537 A | * | 11/1998 | Doty | ...................... G01C 19/72 356/484 |
| 6,788,520 B1 | | 9/2004 | Behin et al. | |
| 6,856,400 B1 | * | 2/2005 | Froggatt | ............ G01M 11/3181 356/477 |
| 7,277,606 B1 | * | 10/2007 | Sakai | ...................... G02B 6/359 385/17 |
| 9,740,002 B2 | | 8/2017 | Kolodkin | |
| 2008/0050064 A1 | * | 2/2008 | Sakai | ...................... G02B 6/359 385/17 |
| 2009/0185251 A1 | | 7/2009 | Chen et al. | |
| 2016/0255318 A1 | * | 9/2016 | Chevallaz | .......... G02B 26/0833 |

* cited by examiner

*Primary Examiner* — Jeff Natalini
(74) *Attorney, Agent, or Firm* — Crowe & Dunlevy

(57) ABSTRACT

Disclosed herein is a circuit for determining failure of a movable MEMS mirror. The circuit includes an integrator receiving an opening angle signal representing an opening angle of the movable MEMS mirror, and a differentiator receiving the opening angle signal. A summing circuit is configured to sum the integrator output and the differentiator output. A comparison circuit is configured to determine whether the sum of the integrator output and differentiator output is not within a threshold window. An indicator circuit is configured to generate an indicator signal indicating that the movable MEMS mirror has failed based on the comparison circuit indicating that the sum of the integrator output and differentiator output is not within the threshold window.

22 Claims, 7 Drawing Sheets

CIRCUIT FOR DETECTION OF FAILURE OF A MOVABLE MEMS MIRROR

TECHNICAL FIELD

This disclosure relates to MEMS mirrors for scanning or deflecting light beams, and, in particular, to techniques and circuits for determining when MEMS mirrors have experienced failures.

BACKGROUND

Certain devices such as wafer defect scanners, laser printers, document scanners, projectors and the like often employ a collimated laser beam that scans across a flat surface in a straight line path. These devices employ tilting mirrors to deflect the beam to perform the scanning. These tilting mirrors may be, or may include, Micro Electro Mechanical Systems ("MEMS") devices.

Common mirrors used in MEMS devices, referred to herein as MEMS mirrors, include a stator and a rotor, with the rotor or structures carried by the rotor being reflective. The stator and/or rotor are driven with a drive signal which results in the rotor oscillating with respect to the stator, thereby changing the angle of reflectance of an incident light beam on the rotor. By oscillating the rotor between two orientations, an opening angle of the mirror is defined, and scanning of the light beam across the flat surface is accomplished.

If a MEMS mirror fails, such as when the rotor undesirably becomes stuck, the laser beam may shine in a fixed direction rather than be oscillating at a high frequency. Where a laser beam becomes fixed, particularly when the laser is of a high power, damage can result to surfaces that the laser shines onto. This damage can occur in a very short period of time, thus it is desirable to not only be able to detect when a MEMS mirror fails so that the laser beam can be switched off, but to detect that failure of the MEMS mirror as quickly as possible.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

Disclosed herein is a circuit for determining failure of a movable MEMS mirror. The circuit includes an integrator receiving as input an opening angle signal representing an opening angle of the movable MEMS mirror and generating an integrator output. A differentiator receives as input the opening angle signal and generates a differentiator output. A summing circuit is configured to sum the integrator output and the differentiator output. A comparison circuit is configured to determine whether the sum of the integrator output and differentiator output is not within a threshold window. An indicator circuit is configured to generate an indicator signal indicating that the movable MEMS mirror has failed based on the comparison circuit indicating that the sum of the integrator output and differentiator output is not within the threshold window.

A low pass filter may be configured to receive an unfiltered opening angle signal and to generate the opening angle signal in response thereto. In addition, the integrator may be an analog integrating amplifier having an input terminal coupled to a signal node to receive therefrom the opening angle signal and an output terminal. The differentiator may be an analog differentiating amplifier having an input terminal coupled to the signal node to receive therefrom the opening angle signal and an output terminal.

The summing circuit may include a voltage divider coupled between the output terminal of the analog integrating amplifier and the output terminal of the analog differentiating amplifier, and having a central output node carrying the sum of the integrator output and the differentiator output.

The threshold window may include an upper threshold level above which failure of the movable MEMS mirror is presumed. The comparison circuit may include a first analog comparator having an input terminal coupled the comparison circuit, an output terminal, and being configured to compare the sum of the integrator output and the differentiator output to the upper threshold level.

The comparison circuit may include a second analog comparator having an input terminal coupled to the comparison circuit, an output terminal, and being configured to compare the sum of the integrator output and the differentiator output to a lower threshold level of the threshold window below which failure of the movable MEMS mirror is presumed.

The comparison circuit may include a NOR gate having a first input terminal coupled to the output terminal of the first comparator, a second input terminal coupled to the output terminal of the second comparator, and an output terminal.

The indicator circuit may include a timer circuit having a reset terminal coupled to the output terminal of the NOR gate and an output terminal. The timer circuit may be configured to begin counting based on receiving an assertion from the NOR gate, to be reset based on receiving a deassertion from the NOR gate, and to generate the indicator signal after reaching a predetermined count number.

The indicator circuit may include a flip flop having an input terminal coupled to the output terminal of the indicator circuit, and configured to be set to generate an alarm based upon assertion of the indicator signal received from the timer circuit.

Also disclosed herein is a circuit including an analog integrating amplifier having a non-inverting terminal coupled to ground, an inverting terminal coupled to a movable MEMS mirror opening angle signal node, and an output terminal. An analog differentiating amplifier has a non-inverting terminal coupled to ground, an inverting terminal coupled to a movable MEMS mirror opening angle signal node, and an output terminal. An analog summer has a first input terminal coupled to the output terminal of the analog integrating amplifier, a second input terminal coupled to the output terminal of the analog differentiating amplifier, and an output terminal. A window comparator has a first input terminal coupled to a positive threshold reference, a second input terminal coupled to a negative threshold reference, and first and second output terminals. A NOR gate has a first input terminal coupled to the first output terminal of the window comparator, a second input terminal coupled to the second output terminal of the window comparator, and an output terminal.

The window comparator includes a first comparator having an inverting terminal coupled to the positive threshold reference, a non-inverting terminal coupled to the output terminal of the analog summer, and an output terminal. A second comparator has a non-inverting terminal coupled to the negative threshold reference, an inverting terminal coupled to the output terminal of the analog summer, and an output terminal.

The analog integrating amplifier may have associated therewith an input resistor coupled between the movable MEMS mirror opening angle signal node and the inverting terminal, a capacitor coupled between the inverting terminal and the output terminal, and a feedback resistor coupled between the inverting terminal and the output terminal.

The analog differentiating amplifier may have associated therewith an input capacitor coupled between the movable MEMS mirror opening angle signal node and the inverting terminal, and a feedback resistor coupled between the inverting terminal and the output terminal.

The analog summer may include a first resistor coupled between the output terminal of the analog integrating circuit and a central output node, and a second resistor coupled between the output terminal of the analog differentiating circuit and the central output node.

A method aspect includes integrating an opening angle signal representing an opening angle of a movable MEMS mirror, differentiating the opening angle signal, and summing the integrated opening angle signal and the differentiated opening angle signal. The method also includes determining whether the sum of the integrated opening angle signal and the differentiated opening angle signal is greater than an upper threshold level or lower than a lower threshold level, and generating an indicator signal indicating that the movable MEMS mirror has failed based on the sum of the integrated opening angle signal and differentiated opening angle signal being greater than the upper threshold level or lower than the lower threshold level.

An unfiltered opening angle signal may be filtered and the opening angle signal may be generated in response thereto. The unfiltered opening angle signal may be read from a piezoresistor associated with the movable MEMS mirror, prior to filtering the unfiltered opening angle signal.

The movable MEMS mirror may be controlled in conjunction with at least one collimated light source as a function of the indicator signal. The movable MEMS mirror and collimated light source may be controlled such that the collimated light source is switched off when the indicator signal indicates that the movable MEMS mirror has failed, or may be controlled such that the collimated light source remains on when the indicator signal indicates that the movable MEMS mirror has not failed.

DETAILED DESCRIPTION

Figure 1:
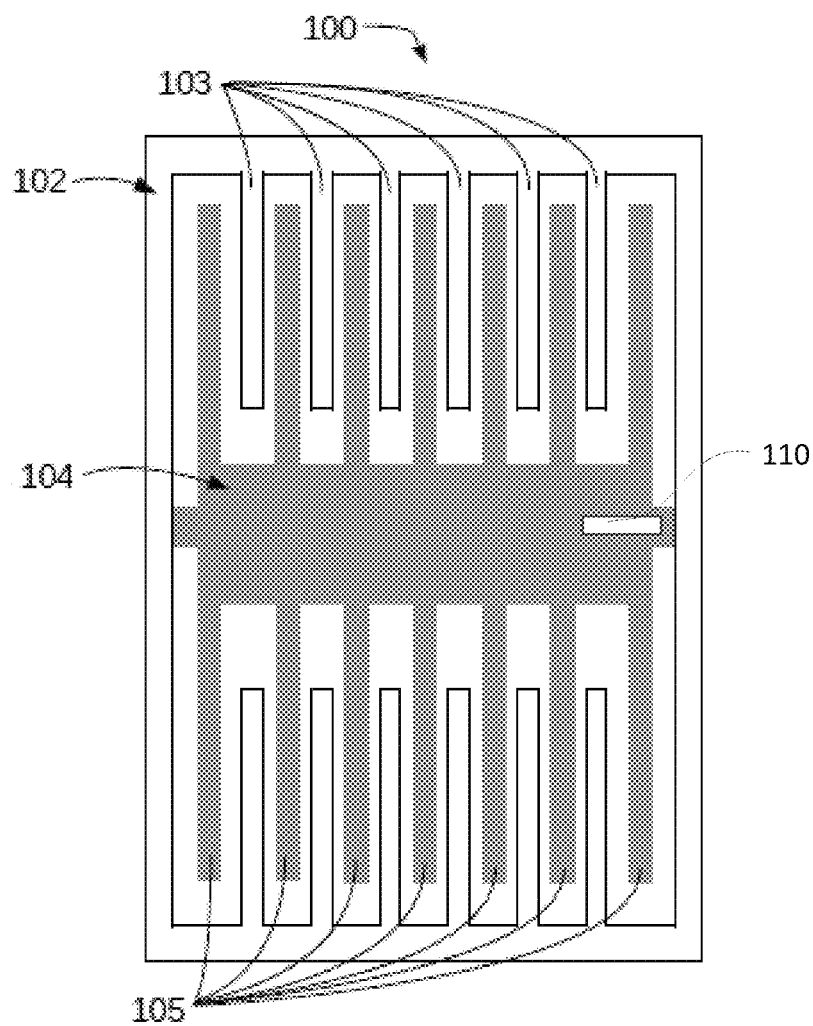
FIG. 1 is a top plan view of a movable MEMS mirror as may be used with the techniques described in this disclosure.

One or more embodiments of the present disclosure will be described below. These described embodiments are only examples of the presently disclosed techniques. Additionally, in an effort to provide a concise description, all features of an actual implementation may not be described in the specification.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Like reference numbers in the drawing figures refer to like elements throughout, and reference numbers separated by century, as well as reference numbers with prime notation, may indicate similar elements in other applications or embodiments.

First, a movable MEMS mirror 100, such as may be used in devices such as wafer defect scanners, laser printers, document scanners, projectors, and pico-projectors, will now be described with reference to FIG. 1. The movable MEMS mirror 100 includes a stator 102 having inwardly projecting fingers 103. A rotor 104 is positioned within the stator 102 and has outwardly projecting fingers 105 that interleave with the inwardly projecting fingers 103 of the stator 102. The rotor 104 oscillates about its axis, oscillating its mirror surface with respect to the stator 102.

Either the stator 102 or the rotor 104 is supplied with a periodic signal, such as a square wave, while the other is supplied with a reference voltage. In the case where the periodic signal has an oscillating square voltage, for example, electrostatic forces cause the rotor 104 to oscillate about its axis relative to the stator 102. In the case where the periodic signal has an oscillating square current, for example, magnetic forces cause the rotor 104 to oscillate about its axis relative to the stator 102. Indeed, the movable MEMS mirror 100 may be driven according to any suitable way known to those of skill in the art.

Figure 2:
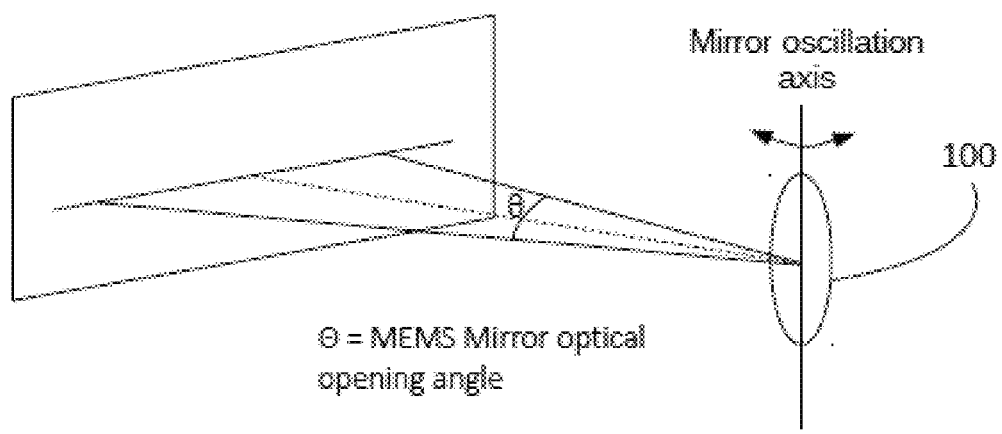
FIG. 2 is a perspective view showing operation of a movable MEMS mirror scanning in accordance with the techniques described in this disclosure.

For use in scanning a light beam across a surface, the movable MEMS mirror 100 is driven so that it oscillates at its resonant frequency between two set or controllable oscillation limits. Shown in FIG. 2 is the movable MEMS mirror 100 scanning a light beam across a projection screen between two set rotation limits that define an "opening angle" θ of the movable MEMS mirror 100.

Figure 3:
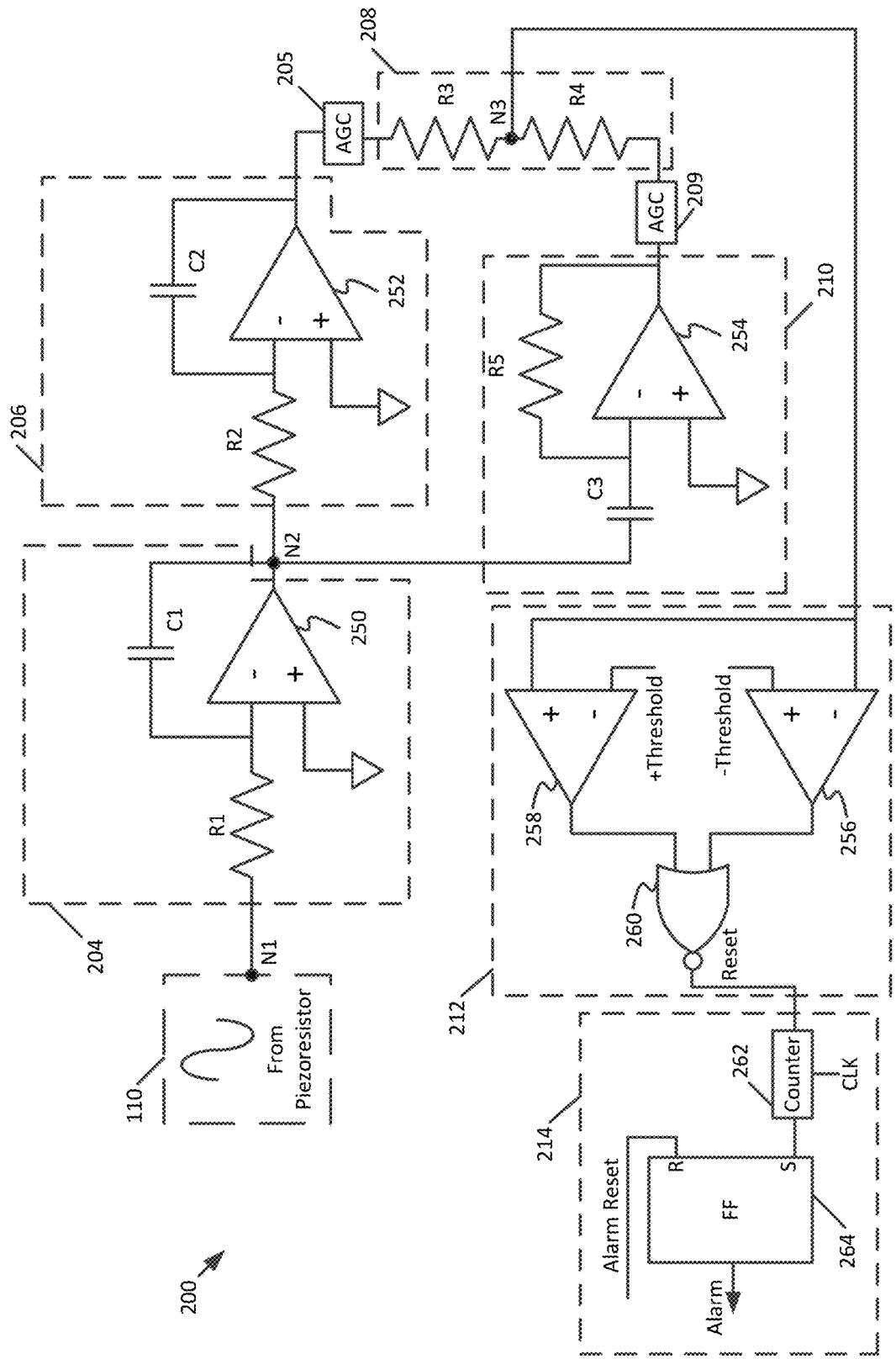
FIG. 3 is a schematic of a circuit for detecting failure of a movable MEMS mirror in accordance with this disclosure.

Referring back to FIG. 1, a piezoelectric circuit 110, such as a piezoelectric resistor bridge, may be associated with the rotor 104 and generate an opening angle signal as a function of the opening angle of the movable MEMS mirror 100. This opening angle signal will be used by a circuit 200 for detecting failure of the movable MEMS mirror 100, as will now be described with reference to FIG. 3.

The circuit 200 includes a low pass filtering block 204 coupled to receive the opening angle signal at node N1. An integrator 206 is coupled to the output of the low pass filtering block 204 at node N2 and receives as input a filtered version of the opening angle signal. The integrator 206 generates an integrator output. A differentiator 210 is also coupled to node N2, and likewise receives therefrom the filtered version of the opening angle signal. The differentiator 210 generates a differentiator output. Automatic gain control (AGC) blocks 205 and 209 are respectively coupled to the outputs of the integrator 206 and differentiator 210.

A summing circuit 208 sums the integrator output and the differentiator output, after the gain of both is adjusted via the AGC blocks 205 and 209, and outputs the sum at its central node N 3. A comparison circuit 212 is coupled to the central node N 3 to receive therefrom the sum of the integrator output and the differentiator output, and determines whether the sum of the integrator output and differentiator output is greater than an upper threshold level, as well as whether the sum of the integrator output and differentiator output is less than a lower threshold level. A reset signal is generated at the output of the comparison circuit 212 if the sum of the integrator output and differentiator output is less than the upper threshold and greater than the lower threshold.

An indicator circuit 214 generates an indicator signal indicating that the movable MEMS mirror 100 has failed based on lack of assertion of the reset signal by the comparison circuit 212. Stated another way, the indicator circuit 214 generates the indicator signal indicating mirror failure when either the sum of the integrator output and differentiator output is greater than the upper threshold level, or the sum of the integrator output and differentiator output is lower than the lower threshold level.

The AGC blocks 205 and 209 serve to perform automatic gain control on the inputs of the integrator 206 and differentiator 210.

Description of the components of the circuit 200 will first be given in greater detail with reference to structure, and thereafter with reference to function.

The filter 204 includes a first amplifier 250 having a non-inverting terminal coupled to a reference voltage, and an inverting terminal coupled to node N1 through resistor R1. A capacitor C1 is coupled between the inverting terminal and the output terminal to provide feedback. A sample value for R1 is 7.96 KΩ, and a sample value for C1 is 100 pF. The output terminal of the first amplifier 250 is coupled to node N2.

The integrator 206 includes an amplifier 252 having a non-inverting terminal coupled to the reference voltage, and an inverting terminal coupled to node N2 through resistor R2. A capacitor C2 is coupled between the inverting terminal and the output terminal to provide feedback. A sample value for R2 is 7.96 KΩ, and a sample value for C2 is 1 nF. The integrator 206 functions to integrate the filtered opening angle signal over time so as to suppress transient changes.

Thus, it can be observed that resistors R1 and R2 have the same value, whereas the value of capacitor C2 is substantially greater than the value of capacitor C1 because two different function are being performed by similar structural components.

The differentiator 210 includes an amplifier 254 having a non-inverting terminal coupled to the reference voltage, and an inverting terminal coupled to node N2 through capacitor C3. A capacitor R5 is coupled between the inverting terminal and the output terminal to provide feedback. A sample value for C3 is 10 pF, and a sample value for R5 is 79.6 KΩ.

Automatic gain control (AGC) blocks 205 and 209 are respectively coupled to the outputs of the integrator 206 and differentiator 210. In particular, the AGC block 205 is coupled to the output of the amplifier 252, and the AGC block 209 is coupled to the output of amplifier 254.

The summing circuit 208 includes resistor R3 coupled between the output of the AGC block 205 and central summing node N3. The summing circuit 208 also includes resistor R4 coupled between the output of the AGC block 209 and central summing node N3. Resistors R3 and R4 have a same value so as to provide for even voltage division at the central summing node N3.

The comparison circuit 212 includes amplifiers 256 and 258. Amplifier 256 has an inverting terminal coupled to the central summing node N3, and thus receives the sum of the integrator output and the differentiator output. Amplifier 256 has a non-inverting terminal coupled to a reference for the lower threshold. Amplifier 258 has a non-inverting terminal coupled to the central summing node N3, and an inverting terminal coupled to a reference for the upper threshold. The NOR gate 260 has a first input terminal coupled to the output terminal of amplifier 258, and a second input terminal coupled to the output terminal of amplifier 256.

The indicator circuit 214 includes a counter 262 receiving the reset signal from the output of the NOR gate 260 as input, and being clocked by the clock signal CLK. A SR flip flop 264 receives output of the counter at its S input, receives an alarm reset signal at its R input, and generates an alarm output. Counter 262 is free running. If the value of the counter exceeds It should be noted that the filter 204, integrator 206, differentiator 210, summer 208, and potentially comparison circuit 212 contain only analog components and do not contain digital components. If digital components are used, to enable quick determination of failure, an analog to digital conversion of the opening angle signal is to be performed at a high frequency. This can increase the cost and power consumption of the device undesirably.

Figure 4:
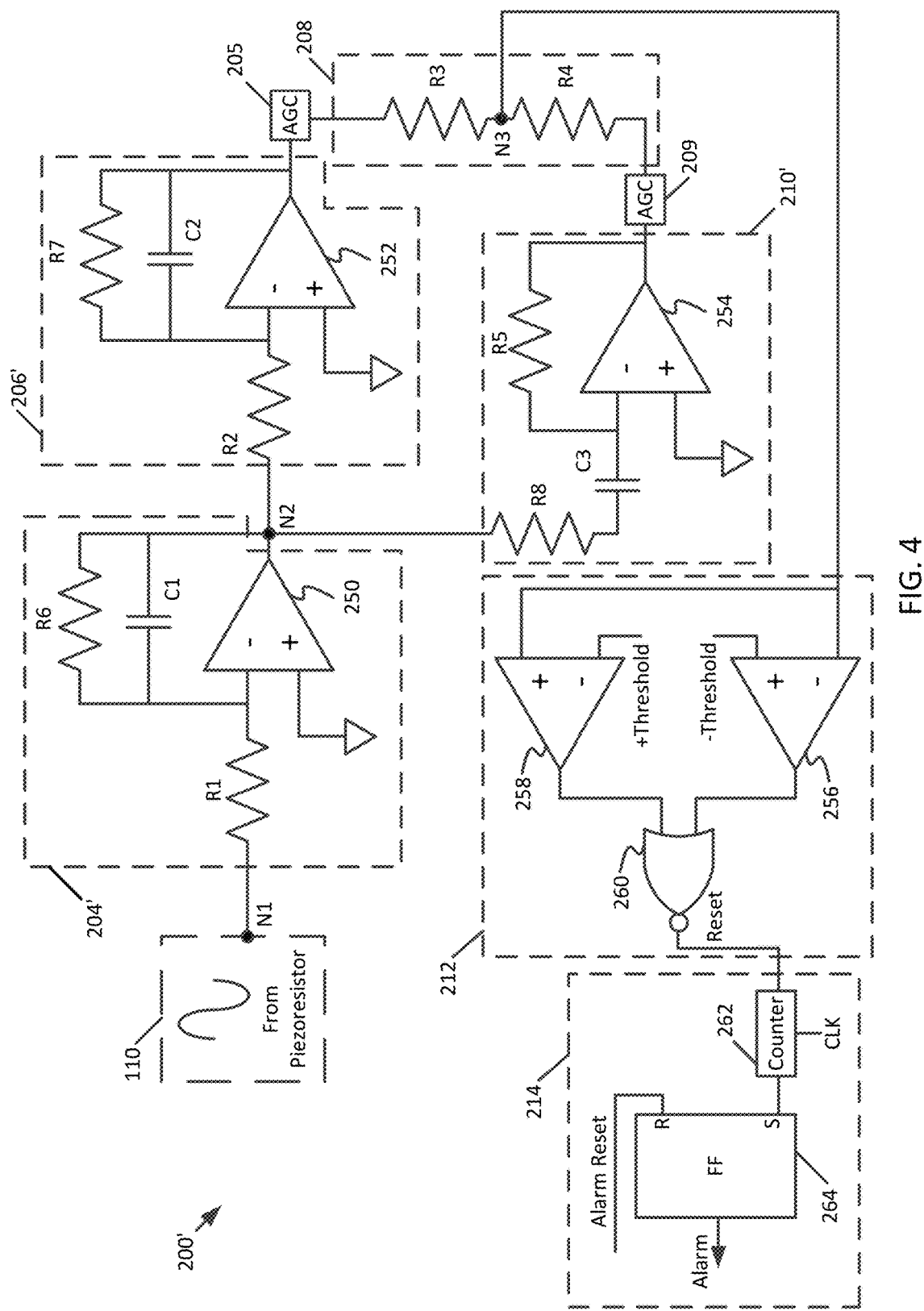
FIG. 4 is a schematic of a further embodiment of a circuit for detecting failure of a movable MEMS mirror in accordance with this disclosure.

In some applications, such as that shown in FIG. 4, there may be a resistor R6 coupled between the inverting input and output of amplifier 250, there may be a resistor R7 coupled between the inverting input and output of amplifier 252, and there may be a resistor R8 coupled between capacitor C3 and node N2. These resistors allow fine tuning of the circuit 200. For example, R7 acts a high leakage resistor for the integrator 206', and R8 acts an input resistor for the differentiator 210'. A sample value for R6 is 7.96 KΩ, a sample value for R7 is 796 KΩ, and a sample value for R8 is 7.96 KΩ.

Greater details of operation of the circuit 200 will now be given. Generally speaking, the circuit 200 operates by detecting the existence of a sine wave signal at node N1. It therefore operates according to the following differential equation:

$$k1\frac{dv}{dt} + k2\int vdt = 0 \qquad (1)$$

This equation can be solved using the Laplace Transform:

$$k1SV + k2\frac{V}{S} = 0 \qquad (2)$$

Applying the Laplace Transform to equation 1 yields:

$$k1S^2V + k2V = 0 \qquad (3)$$

One trivial solution is V≡0. The other solutions are:

$$k1S^2 + k2 = 0, \tag{4}$$

$$S^2 = -\frac{k2}{k1}, \text{ and} \tag{5}$$

$$S = Ae^{j\frac{k2}{k1}} + Be^{-j\frac{k2}{k1}} \tag{6}$$

In operation, the filter 204 performs a low pass filtering on the opening angle signal. The integrator 206 integrates the opening angle signal after low pass filtering, and the result can be mathematically represented as:

$$-\frac{1}{SR_iC_i} \tag{7}$$

The differentiator 210 differentiates the opening angle signal after low pass filtering, and the result can be mathematically represented as:

$$-SR_dC_d \tag{8}$$

The summer 208 sums the output from the integrator 206 with the output from the differentiator 210. With respect to the sample values for the resistors and capacitors described above, it is noted that the desired signal at the central node N3 of the summer 208 is:

$$\frac{1}{SR_iC_i} + SR_dC_d = 0 \tag{9}$$

Substituting $S=j\omega_r$, the result is:

$$\frac{1}{j\omega_rR_iC_i} + j\omega_rR_dC_d = 0 \tag{10}$$

$$\frac{1}{\omega_rR_iC_i} = \omega_rR_dC_d = 0 \tag{11}$$

Setting the same values for R and C yields:

$$R^2C^2 = \frac{1}{\omega_r^2} \tag{12}$$

$$RC = \frac{1}{2\pi f_r} \tag{13}$$

Solving for the nominal value yields:

$$RC = \frac{1}{2\pi 20000} \tag{14}$$

Setting C=100 pF yields:

$$R = \frac{1}{2\pi 20000 * 100p} = \frac{10^6}{2\pi 2} \approx 79.6 \text{ K}\Omega \tag{15}$$

Continuing with description of operation of the circuit 100, AGC blocks 205 and 209 function in a "slow attack, slow decay mode", such that corrections are slowly made, and serve to control the gain of the integrator 206 and differentiator 210 so as to provide for high sensitivity. The amplifier 256 is configured as a comparator and compares the sum of the output from the integrator 206 and the output from the differentiator 210 to the lower threshold, and outputs a logic low signal if the sum is greater than the lower threshold. The amplifier 258 is configured as a comparator and compares the sum of the output from the integrator 206 and the output from the differentiator 210 to the upper threshold, and outputs a logic low signal if the sum is less than the upper threshold.

Since NOR gate 260 operates according to NOR logic, it outputs a logic low signal unless both of its inputs, received from comparators 256, 258, are at a logic low. Where both inputs are at a logic low, the NOR gate 260 asserts its output as the rest signal.

The counter 262 serves to count to a predetermined value, such as 8. Where the predetermined value is successfully reached, the counter 262 asserts its output to the S input of the SR flip flop 264, causing setting thereof. Where the reset signal is asserted, the counter 262 resets its counter to zero. Thus, where the MEMS mirror is functioning properly, the counter 262 will not be able to count to the predetermined value. Also, where the sum of the output from the integrator 206 and the output from the differentiator 210 is briefly either above the upper threshold or below the lower threshold briefly due to noise, the counter 262 will still be reset before reaching the predetermined number because the sum will quickly return to being between the upper and lower thresholds. Also, the integrator 206 and differentiator 210 will help to minimize noise in the circuit 200.

Figure 5:
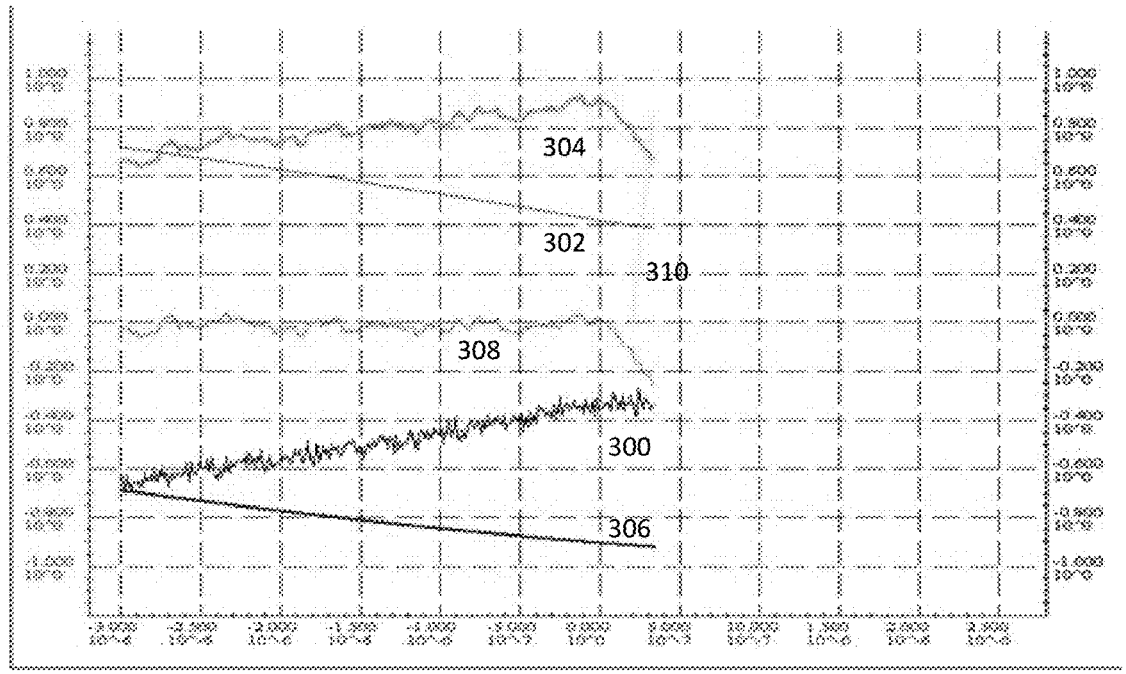
FIG. 5 is a graph of signals at various points of the circuits of FIG. 3 or 4 in a first operation example in which the movable MEMS mirror is zeroed.

Shown in FIG. 5 is a graph of signals of the circuit 200 in operation in a first example. The signal 300 represents the opening angle signal after additive white Gaussian noise of about −29 dB, the signal 302 represents the opening angle signal after passing through the filter 204, the signal 304 represents the output of the differentiator 210, the signal 306 represents the output of the integrator 206, and the signal 308 represents the sum of the integrator and differentiator outputs. At time t=0, the movable MEMS mirror becomes stuck, and the sum signal 308 rises beyond the upper limit of 0.1. The counter then starts counting, as represented by signal 310, ultimately achieving a predetermined value of 8, and failure of the movable MEMS mirror is determined.

Figure 6:
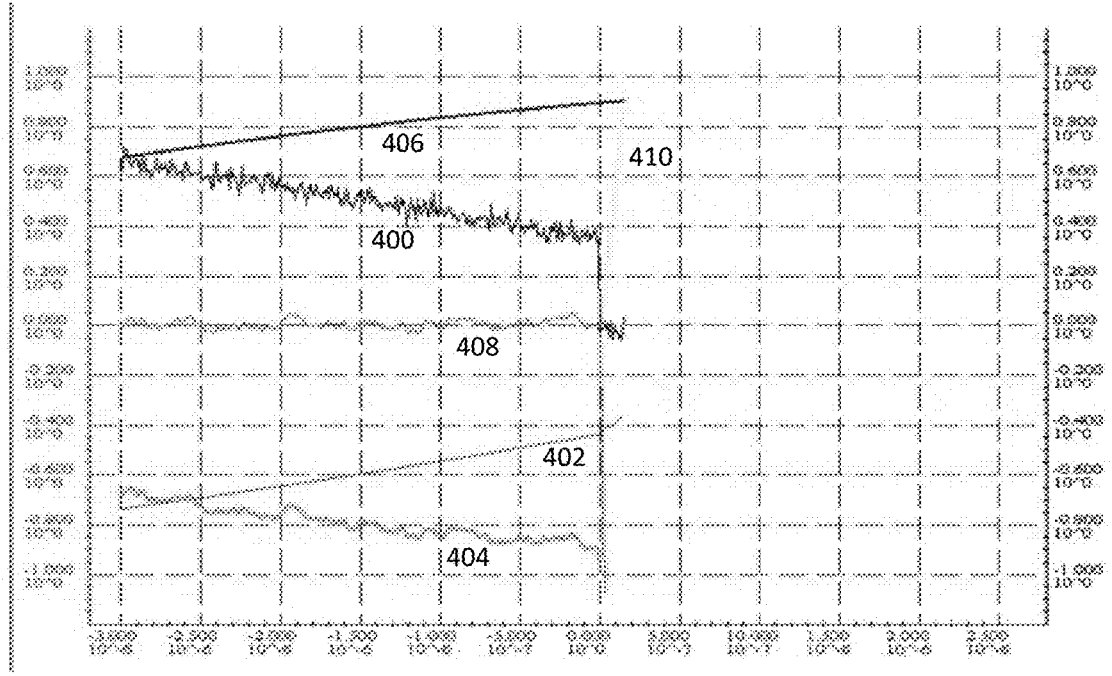
FIG. 6 is a graph of signals at various points of the circuits of FIG. 3 or 4 in a second operation example in which the movable MEMS mirror is stuck.

Shown in FIG. 6 is a graph of signals of the circuit 200 in operation in a second example. The signal 400 represents the opening angle signal after additive white Gaussian noise of about −29 dB, the signal 402 represents the opening angle signal after passing through the filter 204, the signal 404 represents the output of the differentiator 210, the signal 406 represents the output of the integrator 206, and the signal 408 represents the sum of the integrator and differentiator outputs. At time t=0, the movable MEMS mirror becomes zeroed, and the sum signal 408 rises beyond the upper limit of 0.1. The counter then starts counting, as represented by signal 410, ultimately achieving a predetermined value of 8, and failure of the movable MEMS mirror is determined.

Figure 7:
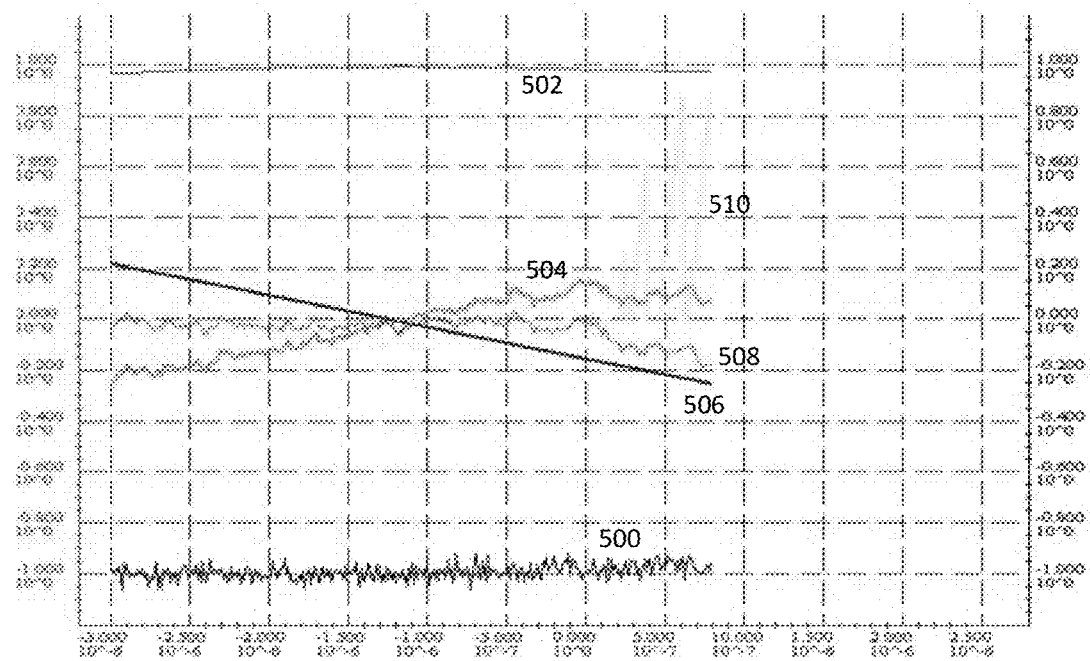
FIG. 7 is a graph of signals at various points in the circuits of FIG. 3 or 4 in a third operation example in which the movable MEMS mirror is stuck.

Shown in FIG. 7 is a graph of signals of the circuit 200 in operation in a third example. The signal 500 represents the opening angle signal after additive white Gaussian noise of about −29 dB, the signal 502 represents the opening angle signal after passing through the filter 204, the signal 504 represents the output of the differentiator 210, the signal 506 represents the output of the integrator 206, and the signal 508 represents the sum of the integrator and differentiator outputs. At time t=0, the movable MEMS mirror becomes stuck, and the sum signal 508 rises beyond the upper limit of 0.1. The counter then starts counting, as represented by signal 510. However, before reaching the predetermined value of 8, the mirror becomes unstuck and the count is reset. After several cycles, the counter is able to reach the predetermined value of 8, and failure of the movable MEMS mirror is determined.

Figure 8:
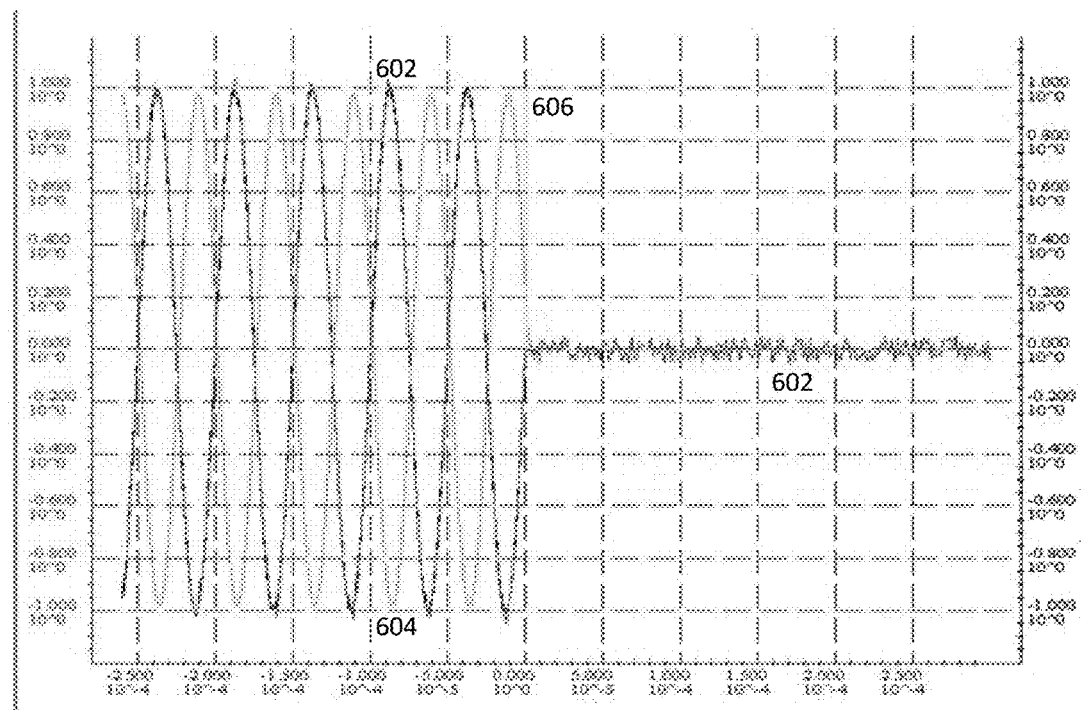
FIG. 8 is a graph of signals at various points of the circuits of FIG. 3 or 4 in fourth operation example.

Shown in FIG. 8 is a graph of signals of the circuit 200 in operation in a fourth example. The signal 602 represents the opening angle signal after additive noise of −20 dB, the signal 604 represents the opening angle signal after passing through the filter 204, and the signal 606 represents the potential alarm signal.

Figure 9:
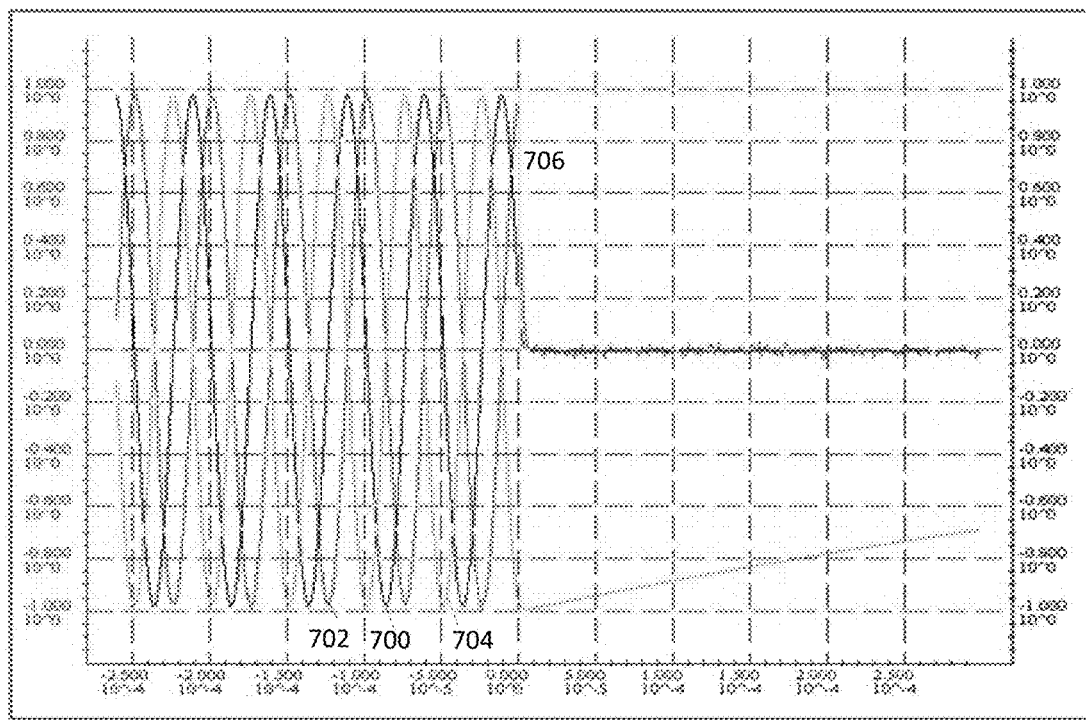
FIG. 9 is a graph of signals at various points of the circuits of FIG. 3 or 4 in fifth operation example.
Figure 10:
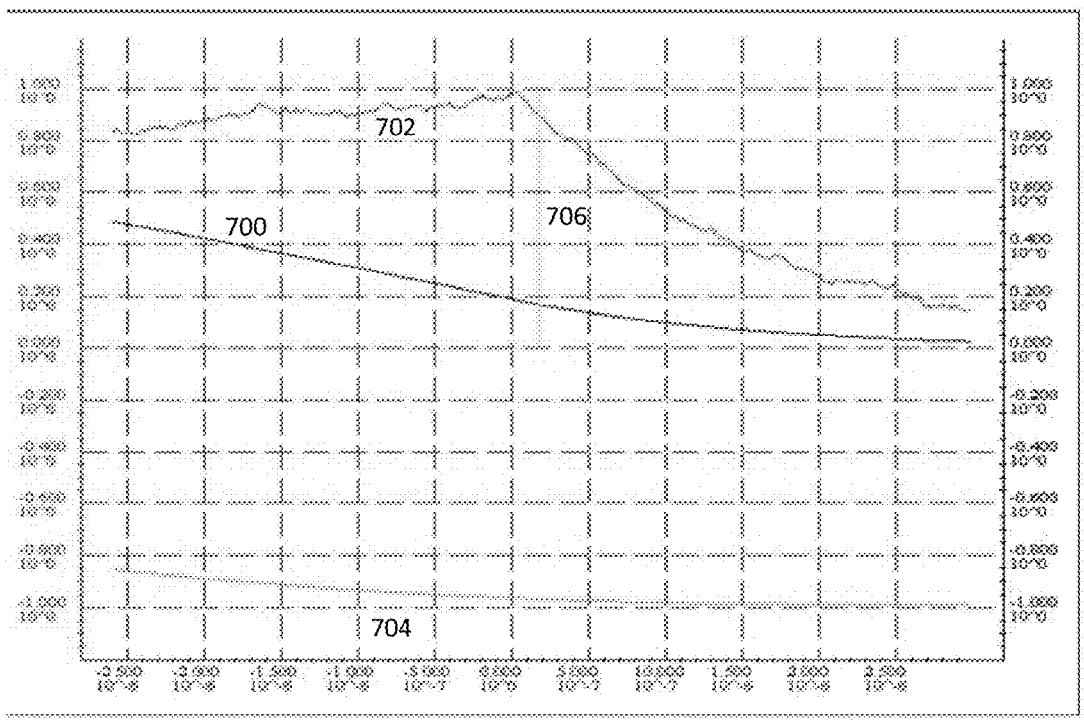
FIG. 10 is a version of the graph of FIG. 9 zoomed in at the point where the potential alarm signal transitions from low to high.

Shown in FIGS. 9-10 are graphs of signals of the circuit 200 in operation in a fifth example. The signal 700 represents the opening angle signal after passing through the filter 204, the signal 702 represents the output of the differentiator 210, the signal 704 represents the output of the integrator 206, and the signal 706 represents the potential alarm signal. At time t=0, the movable MEMS mirror becomes stuck, and failure of the movable MEMS mirror is determined.

Figure 11:
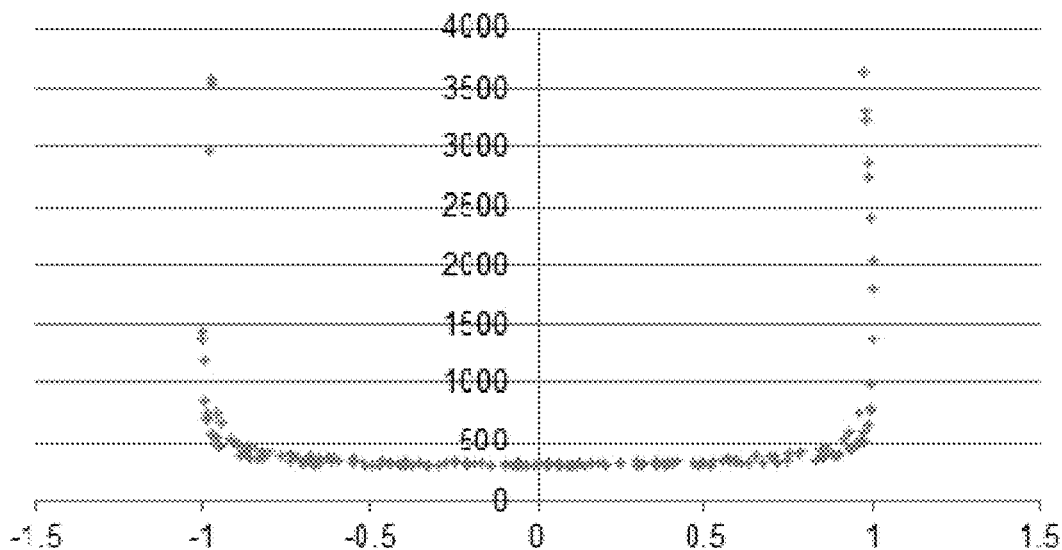
FIG. 11 is a histogram of 200 test cycles of the circuits of FIG. 3 or 4 in which the movable MEMS mirror is stuck.
Figure 12:
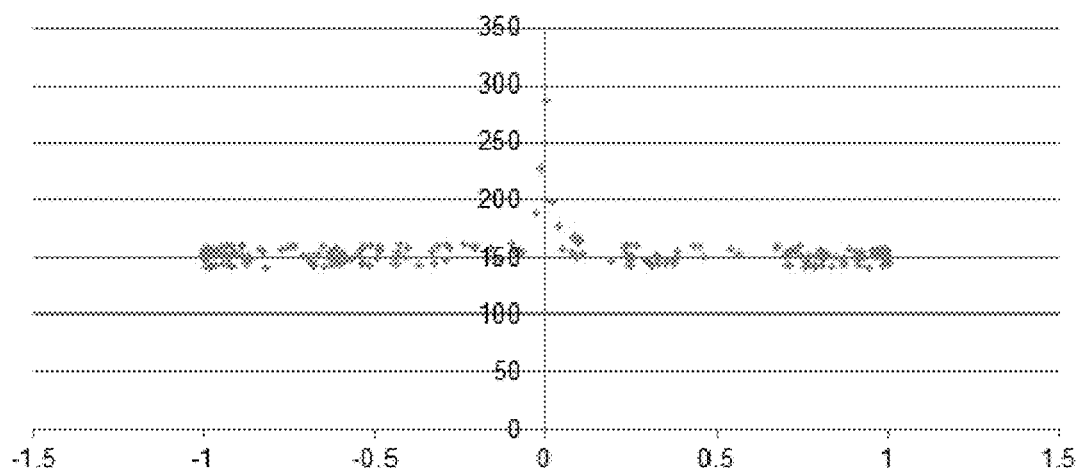
FIG. 12 is a histogram of 200 test cycles of the circuits of FIG. 3 or 4 in which the movable MEMS mirror is zeroed.

FIG. 11 shows a histogram of tests of the circuit 200 where the MEMS mirror is stuck. The x-axis shows the signal amplitude when the stuck condition occurs, and the Y axis shows the delay time before the circuit 200 indicates that the MEMS mirror has failed. Similarly, FIG. 12 shows a histogram of tests of the circuit 200 where the MEMS mirror is zeroed. The x-axis shows the signal amplitude when the zeroed condition occurs, and the Y axis shows the delay time before the circuit 200 indicates that the MEMS mirror has failed.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A circuit for determining failure of a movable MEMS mirror, comprising:
    an integrator configured to receive as input an opening angle signal representing an opening angle of the movable MEMS mirror and to generate an integrator output;
    a differentiator configured to receive as input the opening angle signal and to generate a differentiator output;
    a summing circuit configured to sum the integrator output and the differentiator output;
    a comparison circuit configured to determine whether the sum of the integrator output and differentiator output is not within a threshold window; and
    an indicator circuit configured to generate an indicator signal indicating that the movable MEMS mirror has failed based on the comparison circuit indicating that the sum of the integrator output and differentiator output is not within the threshold window.

2. The circuit of claim 1, further comprising a first automatic gain control circuit configured to control a gain of the integrator output prior to receipt of the integrator output by the summing circuit, and a second automatic gain control circuit configured to control a gain of the differentiator output prior to receipt of the differentiator output by the summing circuit.

3. The circuit of claim 1, further comprising a low pass filter configured to receive an unfiltered opening angle signal and to generate the opening angle signal in response thereto.

4. The circuit of claim 1, wherein the integrator comprises an analog integrating amplifier having an input terminal coupled to a signal node to receive therefrom the opening angle signal, and having an output terminal.

5. The circuit of claim 4, wherein the differentiator comprises an analog differentiating amplifier having an input terminal coupled to the signal node to receive therefrom the opening angle signal, and having an output terminal.

6. The circuit of claim 5, wherein the summing circuit comprises a voltage divider coupled between the output terminal of the analog integrating amplifier and the output terminal of the analog differentiating amplifier, and having a central output node indicating the sum of the integrator output and the differentiator output.

7. The circuit of claim 1, wherein the threshold window includes an upper threshold level above which failure of the movable MEMS mirror is presumed; wherein the comparison circuit comprises a first analog comparator having an input terminal coupled the comparison circuit and having an output terminal, the first analog comparator configured to compare the sum of the integrator output and the differentiator output to the upper threshold level.

8. The circuit of claim 7, wherein the comparison circuit further comprises a second analog comparator having an input terminal coupled to the comparison circuit and having an output terminal, and configured to compare the sum of the integrator output and the differentiator output to a lower threshold level of the threshold window below which failure of the movable MEMS mirror is presumed.

9. The circuit of claim 8, wherein the comparison circuit further comprises a NOR gate having a first input terminal coupled to the output terminal of the first comparator, a second input terminal coupled to the output terminal of the second comparator, and an output terminal.

10. The circuit of claim 9, wherein the indicator circuit comprises a timer circuit having a reset terminal coupled to the output terminal of the NOR gate and having an output terminal; wherein the timer circuit is configured to begin counting based on receiving an assertion from the NOR gate, to be reset based on receiving a deassertion from the NOR gate, and to generate the indicator signal after reaching a predetermined count number.

11. The circuit of claim 10, wherein the indicator circuit further comprises a flip flop having an input terminal coupled to the output terminal of the indicator circuit, the indicator circuit configured to be set to generate an alarm based upon assertion of the indicator signal received from the timer circuit.

12. A circuit, comprising:
    an analog integrating amplifier having a non-inverting terminal coupled to ground, an inverting terminal coupled to a movable MEMS mirror opening angle signal node, and an output terminal;
    an analog differentiating amplifier having a non-inverting terminal coupled to ground, an inverting terminal coupled to a movable MEMS mirror opening angle signal node, and an output terminal;
    an analog summer having a first input terminal coupled to the output terminal of the analog integrating amplifier, a second input terminal coupled to the output terminal of the analog differentiating amplifier, and an output terminal;
    a window comparator having a first input terminal coupled to a positive threshold reference, a second input terminal coupled to the output terminal of the analog summer, a third input terminal coupled to a negative threshold reference, a fourth input terminal coupled to the output terminal of the analog summer, and first and second output terminals;

a NOR gate having a first input terminal coupled to the first output terminal of the window comparator, a second input terminal coupled to the second output terminal of the window comparator, and an output terminal.

13. The circuit of claim 12, wherein the window comparator comprises:
a first comparator having an inverting terminal coupled to the positive threshold reference, a non-inverting terminal coupled to the output terminal of the analog summer, and an output terminal; and
a second comparator having an non-inverting terminal coupled to the negative threshold reference, an inverting terminal coupled to the output terminal of the analog summer, and an output terminal.

14. The circuit of claim 12, wherein the analog integrating amplifier has associated therewith an input resistor coupled between the movable MEMS mirror opening angle signal node and the inverting terminal, a capacitor coupled between the inverting terminal and the output terminal, and a feedback resistor coupled between the inverting terminal and the output terminal.

15. The circuit of claim 12, wherein the analog differentiating amplifier has associated therewith an input capacitor coupled between the movable MEMS mirror opening angle signal node and the inverting terminal and a feedback resistor coupled between the inverting terminal and the output terminal.

16. The circuit of claim 12, wherein the analog summer comprises a first resistor coupled between the output terminal of the analog integrating amplifier and a central output node, and a second resistor coupled between the output terminal of the analog differentiating amplifier and the central output node.

17. A method, comprising:
integrating an opening angle signal representing an opening angle of a movable MEMS mirror, using an integrator circuit;
differentiating the opening angle signal, using a differentiator circuit;
summing the integrated opening angle signal and the differentiated opening angle signal, using a summing circuit;
determining whether the sum of the integrated opening angle signal and the differentiated opening angle signal is greater than an upper threshold level or lower than a lower threshold level, using a comparison circuit; and
generating an indicator signal indicating that the movable MEMS mirror has failed based on the sum of the integrated opening angle signal and differentiated opening angle signal being greater than the upper threshold level or lower than the lower threshold level, using an indicator circuit.

18. The method of claim 17, further comprising filtering an unfiltered opening angle signal and generating the opening angle signal in response thereto.

19. The method of claim 18, further comprising reading the unfiltered opening angle signal from a piezoresistor associated with the movable MEMS mirror, prior to filtering the unfiltered opening angle signal.

20. The method of claim 18, further comprising controlling the movable MEMS mirror in conjunction with at least one collimated light source as a function of the indicator signal.

21. The method of claim 20, wherein the movable MEMS mirror and collimated light source are controlled such that the collimated light source is switched off when the indicator signal indicates that the movable MEMS mirror has failed.

22. The method of claim 20, wherein the movable MEMS mirror and collimated light source are controlled such that the collimated light source remains on when the indicator signal indicates that the movable MEMS mirror has not failed.

* * * * *